United States Patent
Iwata et al.

[11] Patent Number: 5,827,409
[45] Date of Patent: Oct. 27, 1998

[54] METHOD AND APPARATUS FOR FORMING THIN FILM FOR LIQUID CRYSTAL DISPLAY

[75] Inventors: Hiroshi Iwata; Katsuya Yoshioka, both of Kawasaki, Japan

[73] Assignee: Anelva Corporation, Fuchu, Japan

[21] Appl. No.: 675,076

[22] Filed: Jul. 3, 1996

[30] Foreign Application Priority Data

Jul. 3, 1995 [JP] Japan ................................ 7-191180

[51] Int. Cl.⁶ .................................................. C23C 14/34
[52] U.S. Cl. ........................ 204/192.15; 204/192.26; 204/192.29; 204/298.07; 204/298.25; 204/298.26
[58] Field of Search ................ 204/192.12, 192.15, 204/192.26, 192.29, 298.07, 298.25, 298.26

[56] References Cited

U.S. PATENT DOCUMENTS

| | | | |
|---|---|---|---|
| 3,962,062 | 6/1976 | Ingrey | 204/192.22 |
| 4,309,261 | 1/1982 | Harding et al. | 204/192.15 |
| 4,428,812 | 1/1984 | Sproul | 204/192.15 |

*Primary Examiner*—Nam Nguyen
*Attorney, Agent, or Firm*—Burns, Doane, Swecker & Mathis, LLP

[57] ABSTRACT

A method for forming a thin film for a liquid crystal display by depositing a metal oxide on a transparent substrate surface by reactive sputtering. The method comprises introducing gaseous argon and gaseous oxygen to a space in front of a cathode provided with a target of the respective metal and depositing a thin film comprising the metal oxide on the substrate by reactive sputtering by operating the cathode while moving the substrate parallel to the front side of the target. The gaseous argon and the gaseous oxygen are introduced so that the partial pressure of the gaseous oxygen is lower at the upstream or the downstream side of the moving direction of the substrate. The gaseous oxygen is diluted with gaseous nitrogen to a predetermined ratio. The thin film comprising the metal oxide is deposited while adjusting the metal concentration gradient of the film.

An apparatus for forming a thin film for a liquid crystal display by depositing a metal oxide on a transparent substrate surface by reactive sputtering.

13 Claims, 9 Drawing Sheets

METHOD AND APPARATUS FOR FORMING THIN FILM FOR LIQUID CRYSTAL DISPLAY

CROSS-REFERENCE TO RELATED APPLICATION

This application is related to U.S. patent application Ser. No. 08/570,511, filed on Dec. 11, 1995, pending.

BACKGROUND OF THE INVENTION

1. Field of the Invention

The present invention relates to liquid crystal color displays. In particular, the present invention relates to a black matrix for a liquid crystal color display widely used in laptop computers and portable televisions.

2. Description of the Related Art

FIG. 10 is a cross-sectional view of a typical TN (Twisted Nematic) type liquid crystal color display having an active matrix drive. As shown in FIG. 10, a liquid crystal color display basically has a structure in which a liquid crystal material 3 is enclosed between two transparent substrates 1 and 2. The inner face of one transparent substrate 1 comprises transparent electrodes 11 for a TFT (Thin Film Transistor) device, and the inner face of the other transparent substrate 2 comprises color filter pixels 21 which collectively form a color filter. Other transparent electrodes 22 are formed on the surface of the color filter pixels 21. The liquid crystal 3 filled in the gap is driven by a voltage applied to the pair of transparent electrodes 11 and 22.

Polarizing films 110 and 210 are provided on the outer faces of their respective transparent substrates 1 and 2. A back light (not shown) is provided as a light source outside the transparent substrate 1 which is provided with the transparent electrode 11.

In the liquid crystal display having the above-mentioned structure, information is displayed when light from the back light transmits through the liquid crystal 3 which is driven by the transparent electrodes 11 and 22. The displayed information is observed from the outside of the transparent electrode 22 which is provided with the color filter pixels 21.

FIG. 11 is a plan view of an arrangement of color filter pixels 21 which form a color filter. There are several arrangements for the color filter pixels 21. FIG. 11 shows a stripe arrangement in which R (red), G (green), and B (blue) stripe pixels 21 are regularly arranged, respectively.

The color filter pixels 21 are formed on the transparent electrode 22 by printing or dyeing methods. In the printing method, a printing ink prepared by mixing a pigment with an ink base and adding desired additives is used.

A black matrix 5 is formed on the sides of each color filter pixel 21 to form a frame around the pixel 21. The pattern pitch ranges from 10 $\mu$m to a few dozen $\mu$m. Since the black matrix 5 is formed with an opaque black material, the black matrix 5 enhances the tone of each pixel 21. As a result, the black matrix 5 provides a distinct tone for each color pixel 21 of the display as a whole.

FIG. 12 is a cross-sectional view of a conventional black matrix 5 shown in FIG. 11. The oxides of metals such as chromium (Cr) are often used as the black matrix material. The black matrix 5 is formed by depositing a chromium oxide thin film (hereinafter "chromium oxide film") 51 on the transparent substrate 2 and then depositing a pure chromium metal thin film (hereinafter "chromium film") 52 on the chromium oxide film 51. External light, e.g., sunlight and room light, enters the chromium oxide film 51 and chromium film 52 in that order.

Such a chromium oxide film is generally deposited by sputtering. For example, the chromium oxide film is deposited by sputtering a target comprising pure chromium in a gaseous oxygen atmosphere. The chromium film is then deposited on the chromium oxide film in a gaseous argon atmosphere.

One of the characteristics generally demanded of the above-mentioned thin film when used in a liquid crystal display is a decrease in reflectance of external light. High reflectance causes the image to blur due to the influence of the reflecting light on the screen of the display.

As an index for evaluating the reflectance of the black matrix, a bottom reflectance which represents the minimum of the spectral reflectance is employed. The limit of a conventional black matrix is 5 of the bottom reflectance.

One method for reducing the reflectance of a black matrix involves adding carbon as an additive to the chromium oxide film. According to this method, the bottom reflectance can be reduced to about 1%. However, this method causes some pinholes to form in the black matrix because of localized coagulation of the carbon. Thus, this method significantly reduces the quality of the liquid crystal display.

Another method for reducing the reflectance of the black matrix involves reducing the thickness of the chromium film layer. However, this method also decreases the darkness of the black matrix. The low darkness of the black matrix allows too much light from the back light to transmit through the black matrix, so that the enhanced effect of the frame of each pixel of the color filter is offset.

A decreased reflectance of external light is generally required not only for the black matrix of the color filter set forth above, but is also required for other thin films used for liquid displays.

SUMMARY OF THE INVENTION

The foregoing drawbacks have been solved by the present invention. It is an object of the present invention to provide for a method and an apparatus that can produce a thin film for a liquid crystal display in which the reflectance of external light on the black matrix is effectively reduced.

In order to achieve the above object, the present invention, in one embodiment, provides for a method for forming a thin film comprising a metal oxide on a substrate by reactive sputtering. The method includes introducing gaseous argon and gaseous oxygen to a space in front of a cathode, the cathode comprising a target which comprises a metal to be deposited; and depositing a thin film comprising a metal oxide of the metal on the substrate while moving the substrate parallel to the front of the target, the thin film having a concentration gradient of the metal. The gaseous argon and the gaseous oxygen are introduced in a manner such that the partial pressure of the gaseous oxygen is lower at the upstream or the downstream side of the moving direction of the substrate. The gaseous oxygen is diluted with gaseous nitrogen at a predetermined ratio. The thin film is deposited while adjusting the concentration gradient of the elemental metal.

In a preferred embodiment, the thin film comprising the metal oxide forms a black matrix for a liquid crystal color display.

In a second embodiment, the present invention provides an apparatus for forming a thin film comprising a metal oxide on a substrate by reactive sputtering. The apparatus includes a cathode comprising a target which comprises a metal to be deposited, the cathode being disposed in a vacuum chamber having a pumping system; an oxygen gas inlet for introducing gaseous oxygen to a space in front of the cathode in the vacuum chamber; an argon gas inlet for introducing gaseous argon into the space in front of the cathode in the vacuum chamber; and a system for moving the substrate parallel to the front of the target in the space in front of the cathode. The oxygen gas inlet introduces the gaseous oxygen in a manner such that the partial pressure thereof is lower at the upstream or the downstream side of the moving direction of the substrate. The oxygen gas inlet comprises a mixer for mixing gaseous nitrogen with the gaseous oxygen to dilute the gaseous oxygen to a predetermined ratio so as to adjust the concentration gradient of the metal in the thin film.

In a preferred embodiment, a plurality of the cathodes is provided in the moving direction of the substrate. Preferably, each cathode has a separate electrical power supply to control its input power.

The oxygen gas inlet comprises a gaseous oxygen inlet system for introducing gaseous oxygen, and the argon gas inlet comprises a gaseous argon inlet system for introducing gaseous argon. Both inlet systems are provided with flow control devices for controlling their respective flows.

The gaseous oxygen inlet system introduces gaseous oxygen while mixing gaseous nitrogen therewith. It has a mixing ratio adjuster for adjusting the mixing ratio of the gaseous oxygen and the gaseous nitrogen.

The apparatus further comprises a gaseous oxygen pumping system for evacuating the vacuum chamber near the position where the gaseous oxygen is introduced by the gaseous oxygen inlet system, a gaseous argon pumping system for evacuating the vacuum chamber near the position where the gaseous argon is introduced by the gaseous argon inlet system, and an evacuation rate controller for each pumping system to control the evacuation rate of each gas.

DESCRIPTION OF THE PREFERRED EMBODIMENTS

The preferred embodiments of the present invention will be explained in detail below.

Figure 1:
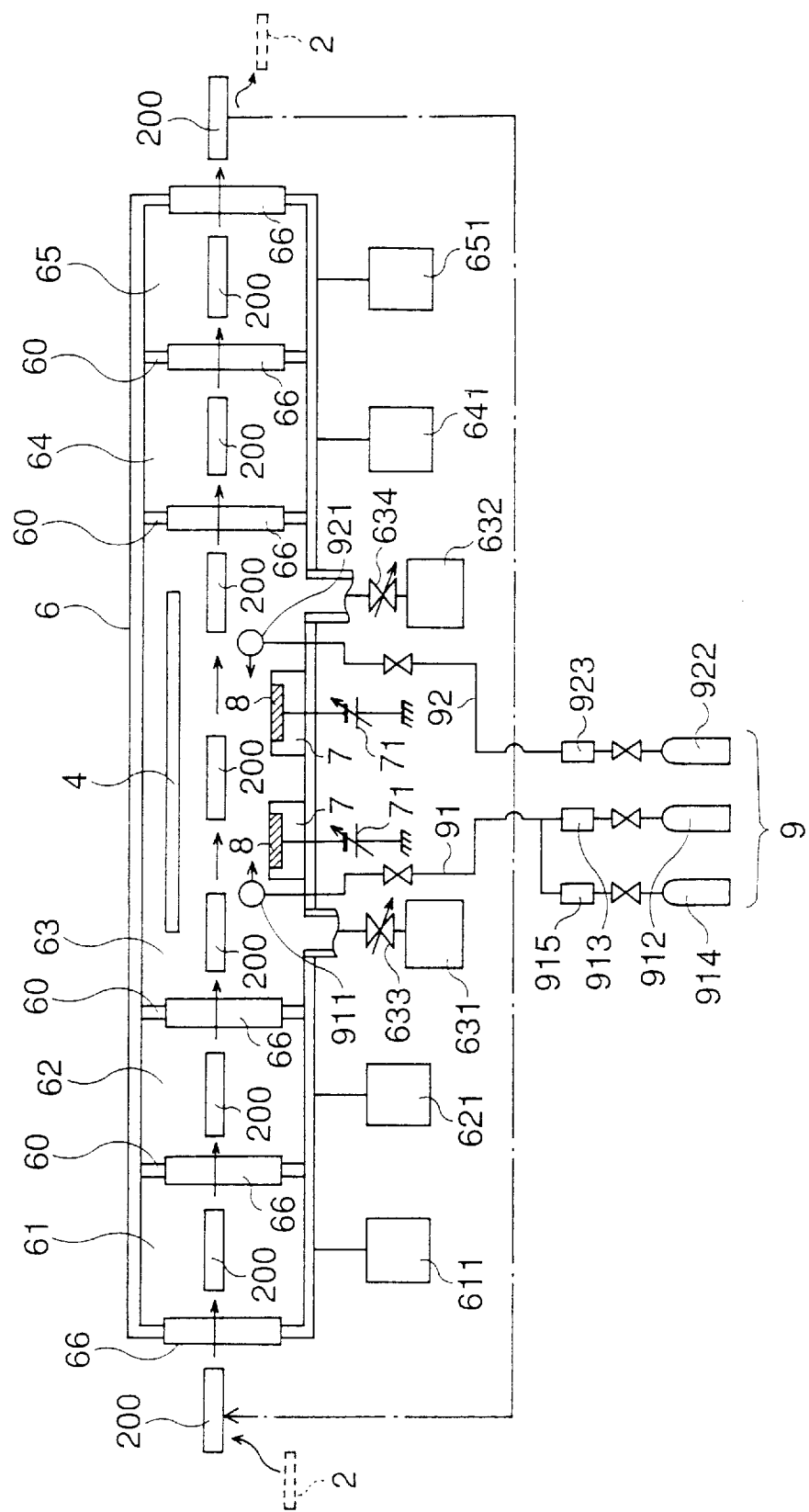
FIG. 1 is a schematic diagram of one embodiment of a method and an apparatus for forming a thin film for a liquid crystal display in accordance with the present invention.
Figure 2:
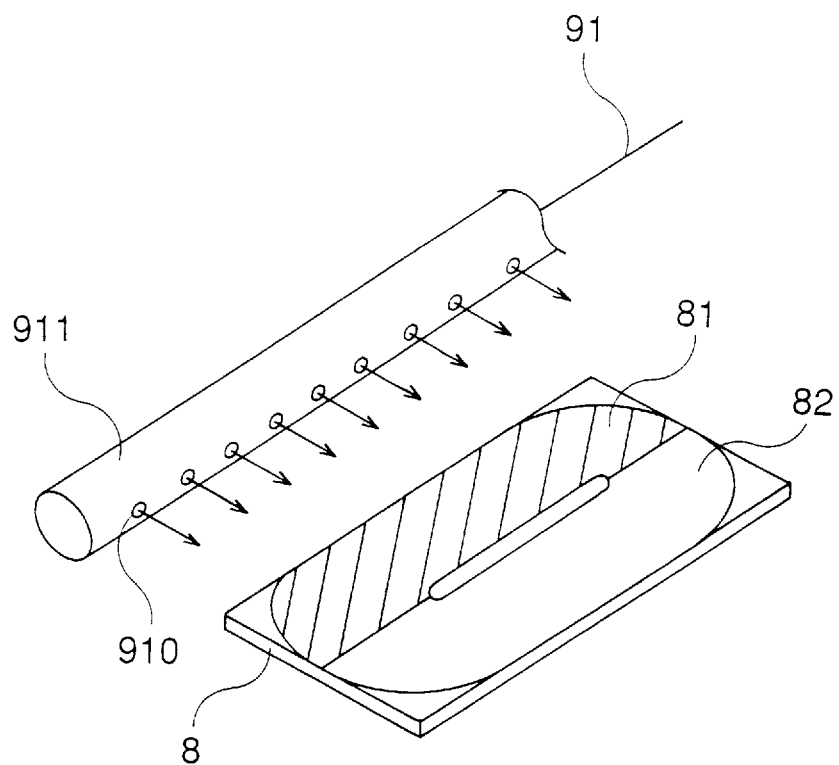
FIG. 2 is a fragmentary isometric view of the apparatus shown in FIG. 1.
Figure 3:
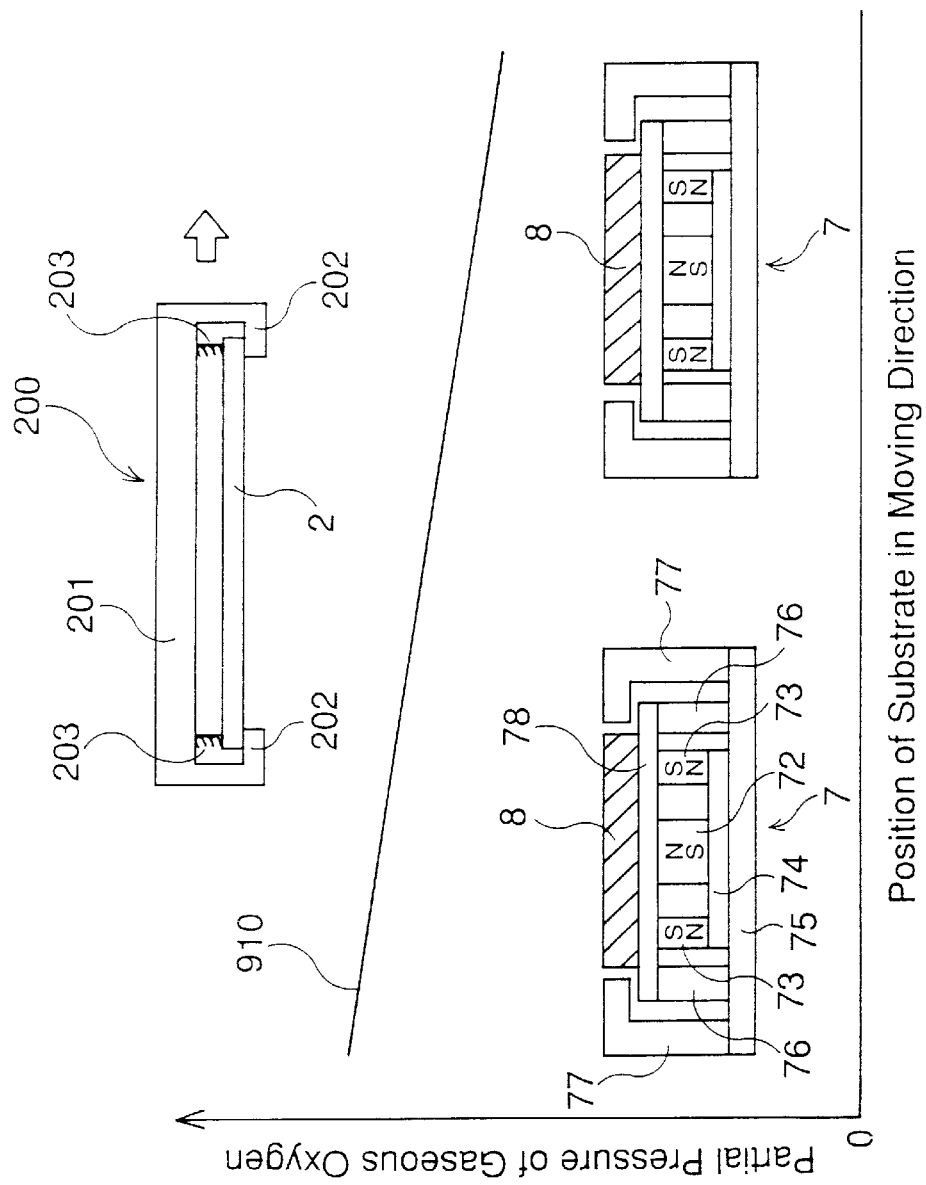
FIG. 3 is a schematic representation of a moving tray and a cathode employed in the apparatus shown in FIG. 1, as well as the variation of the partial pressure of gaseous oxygen in the apparatus.

FIG. 1 is a schematic diagram of one embodiment of a method and an apparatus for forming a thin film for a liquid crystal according to the present invention. FIG. 2 is a fragmentary isometric view of the apparatus shown in FIG. 1. FIG. 3 is a schematic representation of a moving tray and a cathode employed in the apparatus shown in FIG. 1 as well as the variation of the partial pressure of gaseous oxygen in the apparatus.

The apparatus shown in FIG. 1 is a type in which a thin film is deposited on a transparent substrate 2 held in a moving tray 200. The apparatus comprises a moving means (not shown) to move the substrate 2 along vacuum chamber 6 which is provided in the moving direction of the transparent substrate 2, and a plurality of cathodes 7 which are provided in the vacuum chamber 6.

The vacuum chamber 6 is divided into a plurality of internal spaces by separators 60. The separators 60 are positioned vertically and perpendicularly to the moving direction of the transparent substrate 2. These internal spaces are referred to as a load-lock chamber 61, a subload-lock chamber 62, a deposition chamber 63, a subunload-lock chamber 64, and an unload-lock chamber 65. All chambers are positioned along the moving direction of the transparent substrate 2.

Each separator 60 has a gate valve 66. During operation, the transparent substrate 2 passes through the load-lock chamber 61, the subload-lock chamber 62, the deposition chamber 63, the subunload-lock chamber 64, and the unload-lock chamber 65, as well as gate valves 66 positioned therebetween.

The load-lock chamber 61 provides a space for loading the transparent substrate 2 into the apparatus without releasing the pressure in the subload-lock chamber 62 and the deposition chamber 63 to the atmosphere. The load-lock chamber 61 is evacuated to approximately $1 \times 10^{-2}$ Pa by a pumping system 611 using a plurality of oil-sealed mechanical pumps and/or turbo-molecular pumps.

The subload-lock chamber 62 provides a space designed to minimize or prevent gas in the deposition chamber 63 from diffusing into the load-lock chamber 61. The subload-lock chamber 62 is evacuated to approximately $1 \times 10^{-4}$ Pa by a pumping system 621 using a cryopump or a similar device.

The subunload-lock chamber 64 provides a space designed to minimize or prevent the diffusion of gas in the deposition chamber 63 into the unload-lock chamber 65. The subunload-lock chamber 64 is evacuated to approximately $1 \times 10^{-4}$ Pa by a pumping system 641 using a cryopump or a similar device, like the subload-lock chamber 62.

The unload-lock chamber 65 provides a space designed to receive the transparent substrate 2 from the apparatus without releasing the pressure in the deposition chamber 63 and the subunload-lock chamber 64 to the atmosphere. The unload-lock chamber 65 is evacuated to approximately $1 \times 10^{-2}$ Pa by a pumping system 651 using a plurality of steps of oil-sealed mechanical pumps and/or turbo-molecular pumps, similar to the load-lock chamber 61.

The deposition chamber 63 for depositing the thin film for the liquid crystal display on the transparent substrate 2 is provided with a gas inlet system 9 and a plurality of cathodes 7. The gas inlet system 9 comprises an oxygen inlet system 91 for introducing gaseous oxygen and an argon inlet system 92 for introducing gaseous argon.

The oxygen inlet system 91 introduces gaseous oxygen into the deposition chamber 63 while mixing gaseous nitrogen therewith, i.e., the oxygen inlet system 91 includes (a) a first inlet pipe 911 for injecting a gaseous oxygen/nitrogen mixture into the deposition chamber 63, (b) an oxygen cylinder 912 and a nitrogen cylinder 914 for supplying oxygen and nitrogen to the first inlet pipe 911, respectively, and (c) an oxygen flow controller 913 and a nitrogen flow controller 915, each disposed in the respective feed lines for gaseous oxygen and nitrogen.

The argon inlet system 92 includes (a) a second inlet pipe 921 for injecting gaseous argon into the deposition chamber 63, (b) an argon cylinder 922 for supplying argon to the second inlet pipe 921, and (c) an argon flow controller 923 disposed in the feed line for gaseous argon.

In this embodiment, the transparent substrate 2 moves from left to right in FIG. 1. The first inlet pipe 911 for injecting the gaseous oxygen/nitrogen mixture is positioned upstream of the moving direction, and the second inlet pipe 921 for injecting the gaseous argon is positioned downstream of the moving direction.

As shown in FIGS. 1 and 2, the inlet pipes 911 and 921 are positioned so that the longitudinal direction of the pipe is perpendicular to the moving direction of the transparent substrate 2. Inlet nozzles 910, each having a port diameter of about 1 mm, are positioned on the side of each inlet pipe 911 and 921 along the longitudinal direction at an interval of about 20 mm.

As shown in FIG. 2, the inlet nozzles 910 of the first inlet pipe 911 are directed downstream of the moving direction of the transparent substrate 2 so as to inject the gas in the moving direction. The inlet nozzles (not shown) of the second inlet pipe 921 are directed upstream of the moving direction of the transparent substrate 2 so as to inject the gas against the moving direction.

The deposition chamber 63 is provided with two pumping systems 631 and 632, as shown in FIG. 1. A first pumping system 631 evacuates the gaseous oxygen/nitrogen mixture introduced through the first inlet pipe 911 through an evacuating pipe connected upstream of the first inlet pipe 911, while a second pumping system 632 evacuates gaseous argon introduced through the second inlet pipe 921 through another evacuating pipe connected downstream of the second inlet pipe 921. Each of the pumping systems 631 and 632 is provided with (a) a cryopump or a similar device to reduce the pressure inside the deposition chamber 63 to about $10^{-5}$ Pa and (b) an evacuation rate controller 633 and 634, respectively, e.g., a variable orifice or a similar device.

In the apparatus according to this embodiment, two cathodes 7 are used as shown in FIG. 1. These two cathodes 7 are positioned between the first and second inlet pipes 911 and 921, along the moving direction of the transparent substrate 2. As shown in FIG. 3, each cathode 7 has a target 8 on its front side facing the moving transparent substrate 2. Each cathode 7 further includes (a) a backing plate 78 positioned at the rear of the target 8; (b) a pair of magnets comprising a central magnet 72 and a surrounding magnet 73 positioned at the rear of the backing plate 78, and a yoke 74 for connecting the central magnet 72 and the surrounding magnet 73; (c) a base plate 75 provided on the rear of the yoke 74; and (d) a shield 77 for preventing undesirable discharge positioned on the base plate 75 so as to cover the side of the cathode 7.

The target 8 comprises a metal suitable for use with the thin film to be deposited. For example, a target 8 comprising pure chromium is used for forming the black matrix set forth above. In FIG. 1, each target 8 connects with a cathode electric source 71 for applying a predetermined negative high voltage which is effective for sputter discharge. Each cathode electric source 71 can control the voltage applied to the target 8. In FIG. 3, the target 8 is insulated from the base plate 75 with an insulation section (not shown), and the base plate 75 and shield 77 are grounded to maintain the ground potential.

Referring back to FIG. 1, a heating means 4 is provided in the deposition chamber 63 to heat the transparent substrate 2 during the deposition process. Suitable heating means include a radiant heating means, e.g., an infrared lamp. The heating means 4 may be positioned so that the transparent substrate 2 is heated from the rear side of the moving tray 200.

The transparent substrate 2 is held and moved through the process on the moving tray 200. In FIG. 3, the moving tray 200 holds the front and rear ends of the moving direction of the transparent substrate 2 with finger sections 202 provided at both ends of the tray base 201. Springs 203 are provided between the held transparent substrate 2 and the tray base 201 in a manner such that the springs 203 push the transparent substrate 2 onto the finger sections 202 to prevent the transparent substrate 2 from shifting while it is being moved.

The moving tray 200 is moved by a moving system (not shown). Preferably, the moving tray 200 is moved by a magnetic coupling means. The magnetic coupling means includes a pair of magnets, one side of which is fixed to the moving tray 200, and another side is fixed to the end section of the driving system which is connected to a motor or a similar device. Both magnets are magnetically coupled to each other through the wall of the vacuum chamber 6. The moving system also comprises a guide means for guiding the movement of the moving tray 200. The target 8 is disposed in a manner such that the substrate 2 is moved substantially parallel to the front side of the target 8 by means of the moving system. In other embodiments, the target 8 may be disposed vertically so that the substrate 2 is moved in a vertical position, or the target 8 may be disposed horizontally so that the substrate 2 is moved in a horizontal position.

A robot (not shown) for loading the transparent substrate 2 into the moving tray 200 may be provided outside of the load-lock chamber 61 in FIG. 1. Another robot (not shown) for unloading the transparent substrate 2 from the moving tray 200 may also be provided. In addition, a tray returning system may be provided for returning the moving tray 200, which has been removed from the unload-lock chamber 65 and unloaded, to the loading position of the transparent electrode 2 outside of the load-lock chamber 61.

The preferred embodiments of a method for forming a thin film for a liquid crystal display according to the present invention will be explained below. The method is based on the operation of the apparatus set forth above.

The transparent substrate 2 on which the thin film is deposited is loaded in the moving tray 200. The moving tray 200 is brought into the load-lock chamber 61. The gate valves 66 on the outer wall of the load-lock chamber 61 and on the boundary wall of the subload-lock chamber 62 are closed in order to evacuate the load-lock chamber 61 to around $1 \times 10^{-2}$ Pa by operating its pumping system 611. This procedure is in contrast to the one used for the subload-lock chamber 62 which is evacuated to $1\times10^{-4}$ Pa beforehand. Then, the gate valve 66 is opened to bring the moving tray 200 into the subload-lock chamber 62.

The moving tray 200 in the subload-lock chamber 62 is then brought into the deposition chamber 63 previously evacuated to $4\times10^{-4}$ Pa by two pumping systems 631 and 632 by opening the gate valve 66 at the boundary between the subload-lock chamber 62 and the deposition chamber 63. The moving tray 200 is placed at a waiting section upstream of the first inlet pipe 911. After the gate valve 66 is closed, the gas inlet system 9 injects the gaseous oxygen/nitrogen mixture and gaseous argon through the first and second inlet pipes 911 and 921, respectively. Two pumping systems 631 and 632 are operated at the same time to maintain the deposition chamber 63 at a given gas pressure by adjusting the evacuation rate.

While the gaseous oxygen/nitrogen mixture and gaseous argon are being injected and evacuated, a negative high voltage is applied to the two cathodes 7 through their respective cathode electrodes 71 to generate a sputter discharge. The moving tray 200 is moved in the space in front of the two cathodes 7 at a predetermined speed. After the moving tray 200 passes downstream of the second inlet pipe 921, it is stopped. During the moving step, a thin film composed of a given metal oxide is deposited on the transparent substrate 2 by reactive sputtering.

The gaseous oxygen/nitrogen mixture and argon which are injected into the deposition chamber sputter the target composed of metal. The sputtered metal travels in the discharge space until it reaches the surface of the transparent substrate 2 to deposit as a thin film. The metal is oxidized with gaseous oxygen injected in this step and deposited as a metal oxide of the target 8 metal. For example, when the black matrix set forth above is prepared, pure chromium is used as the target material 8 to deposit a thin film of chromium oxide on the transparent substrate 2 by sputtering.

"Oxidation" in the reactive sputtering step set forth above occurs on the surfaces of the target 8 and the transparent substrate 2, and may occur partly in the discharge space. During operation, the surface of the target 8 is oxidized to form a surface oxide layer. The surface oxide may be sputtered and deposited on the transparent substrate 2. Alternatively or in conjunction therewith, the metal deposited on the transparent substrate 2 may be oxidized to form a metal oxide layer. Occasionally, the sputtered metal is oxidized while travelling in the discharge space and is deposited on the transparent substrate 2 as a metal oxide.

After the thin film deposition takes place as set forth above, the transparent substrate 2 is brought into the subunload-lock chamber 64, which has previously been evacuated to $4\times10^{-4}$ Pa, through the gate valve 66 at the boundary between the deposition chamber 63 and subunload-lock chamber 64. Since gas is diffused from the deposition chamber 63 into the subunload-lock chamber 64, the subunload chamber 64 is evacuated by closing the gate valve 66 at the boundary between the deposition chamber 63 and the subunload-lock chamber 64. After the gate valve 66 between the subunload-lock chamber 64 and the unload-lock chamber 65 is opened and the moving tray 200 is brought into the unload-lock chamber 65, the vacuum of the unload-lock chamber 65 is broken by introducing air through a ventilation valve (not shown). Then, the gate valve 66 at the outside wall of the unload-lock chamber 65 is opened to remove the moving tray 200 from the vacuum chamber 6. The transparent substrate 2 is removed from the moving tray 200 by any suitable means, such as a robot (not shown). The moving tray 200 is transferred to the position for loading the transparent substrate 2 by means of the tray returning system (not shown).

In the apparatus aspect of this embodiment, gaseous oxygen plays an important role in the film deposition of the metal oxide. The injected gaseous oxygen forms a predetermined distribution of the partial pressure in the discharge space. The first inlet pipe 911 for injecting a gaseous oxygen/nitrogen mixture is placed upstream of the second inlet pipe 921 for injecting gaseous argon. Thus, as shown in line 910 of FIG. 3, the oxygen is distributed in a manner such that the partial pressure thereof gradually decreases in the downstream direction of the discharge space. The discharge space is located between the two cathodes 7.

When the partial pressure of oxygen is as shown in FIG. 3, film deposition on the transparent substrate 2 carried by the moving tray 200 is conducted first in the highest oxygen partial pressure and then in a gradually decreasing oxygen partial pressure. As shown in FIG. 2, the target 8 has two erosion regions 81 and 82. In the first erosion region 81 which is closer the first inlet pipe 911, oxygen is abundantly supplied to cause intensive oxygen reactive sputtering. In contrast, in the second erosion region 82 which is farther from the first inlet pipe 911, since the amount of the supplied oxygen gradually decreases, nonreactive sputtering due to argon ions gradually dominates.

Since film deposition is carried out while the transparent substrate 2 is moving, the first thin film layer deposited on the substrate 2 has a higher oxygen content or a lower elemental metal content. Thin film layers deposited thereafter have gradually decreased oxygen contents or gradually increased elemental metal contents. As a result, the final thin film having a predetermined thickness has a gradient of the elemental metal content, i.e., a lower elemental metal content near the surface of the transparent substrate 2 and a higher elemental metal content near the surface of the deposited film.

According to the study carried out by the present inventors, it has been found that a thin film having a gradient of the elemental metal content in its thickness direction effectively decreases the reflectance of external light. This will be explained in detail with reference to FIGS. 4 to 8, which show a black matrix of a color filter.

Figure 4:
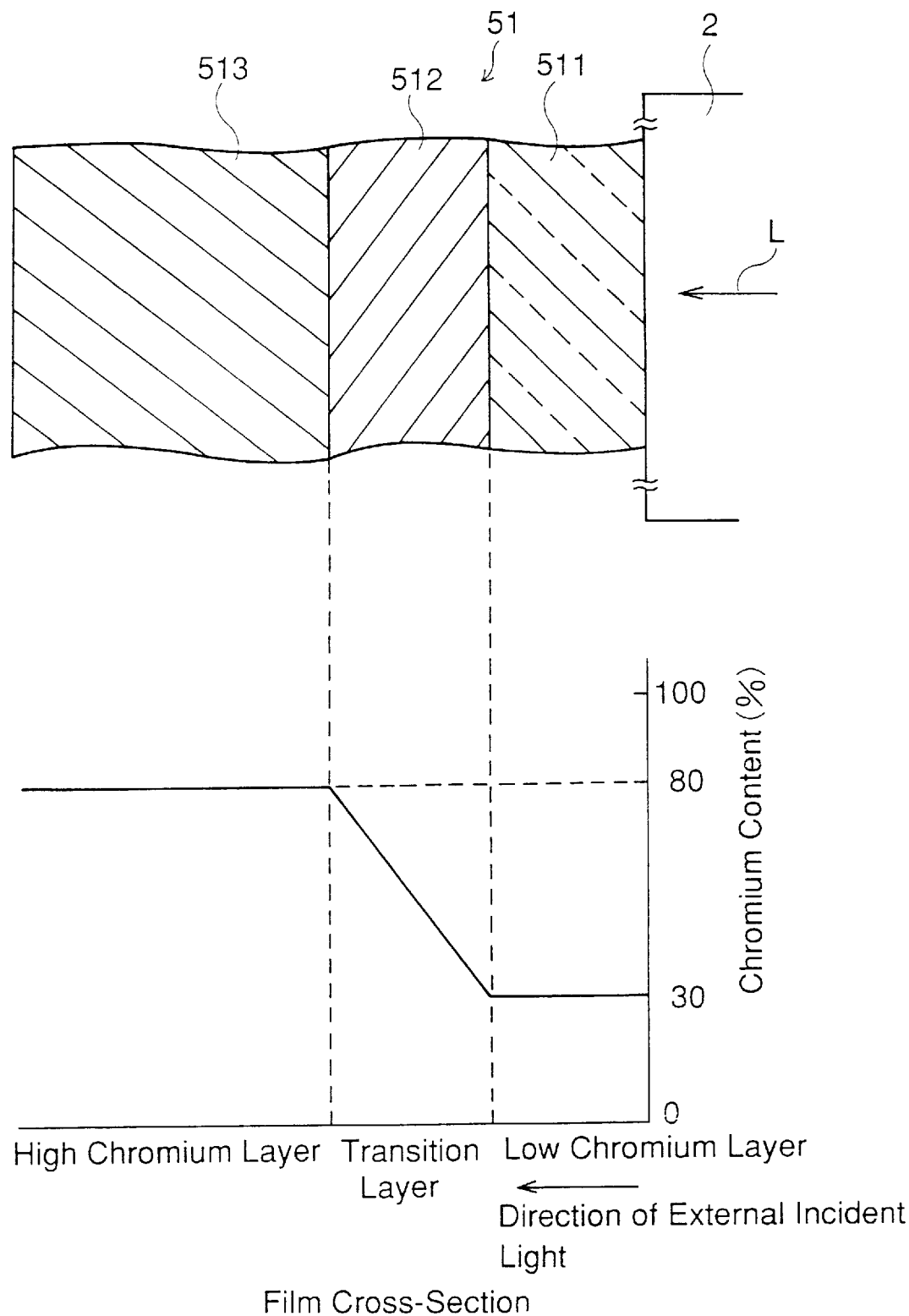
FIG. 4 is a schematic diagram illustrating an outlined cross-section and its respective composition distribution of a black matrix prepared by the apparatus and method in accordance with the embodiment of FIG. 1.

FIG. 4 is a schematic diagram illustrating an outlined cross-section and its respective composition distribution of a black matrix prepared by the apparatus and method according to the embodiment of the present invention set forth above.

The black matrix is prepared by depositing a chromium oxide film 51 on the transparent substrate 2. The transparent substrate 2 can be a soda-lime glass or an alkali-free glass.

Figure 10:
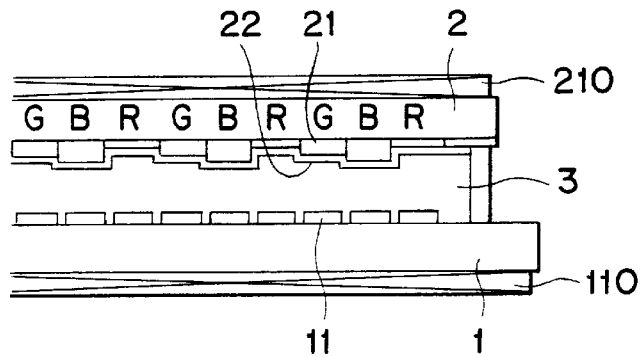
FIG. 10 is a cross-sectional view illustrating a conventional liquid crystal color display.

In the liquid crystal display shown in FIG. 10, when a chromium oxide film 51 is formed on the external light incident surface of the transparent substrate 2 (i.e., the side opposite to the back light side) using the method and apparatus according to the embodiment of the present invention set forth above, the chromium oxide film 51 comprises a low chromium layer 511, a transition layer 512, and a high chromium layer 513, in order along the incident direction (shown as arrow L) of the external light into the liquid crystal display. The low chromium layer 511 has the lowest chromium content, the transition layer 512 has a gradually increasing chromium content along the incident direction L of the external light, and the high chromium layer 513 has the highest chromium content.

Here, the chromium content is the molar ratio of elemental chromium contained in the chromium oxide set forth above. The chromium oxide film 51 contains chromium oxide compounds having six different oxidation numbers: 2, 3, 4, 5, 6, and 10. The chromium oxide compounds are in the forms of $CrO$, $Cr_2O_3$, $CrO_2$, $Cr_2O_5$, $CrO_3$, and $CrO_5$, respectively. In addition, $Cr_3O_5$, $Cr_5O_9$, $Cr_5O_{12}$, $Cr_5O_{13}$, $Cr_3O_8$, and $CrO_4$ have also been found. The molar ratio of elemental chromium to such various chromium oxides produces a gradient as shown in FIG. 4.

Figure 12:
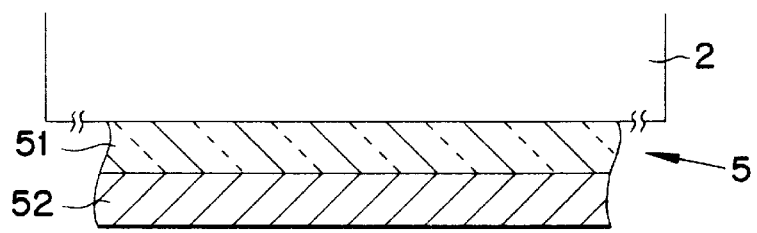
FIG. 12 is a cross-sectional view of a conventional black matrix.

The present inventors have confirmed by experiments that when the transition layer 512 is provided as shown in FIG. 4, the reflectance of the external light is significantly decreased compared with the direct lamination of the chromium oxide film 51 and chromium film 52 as shown in FIG. 12.

Figure 5:
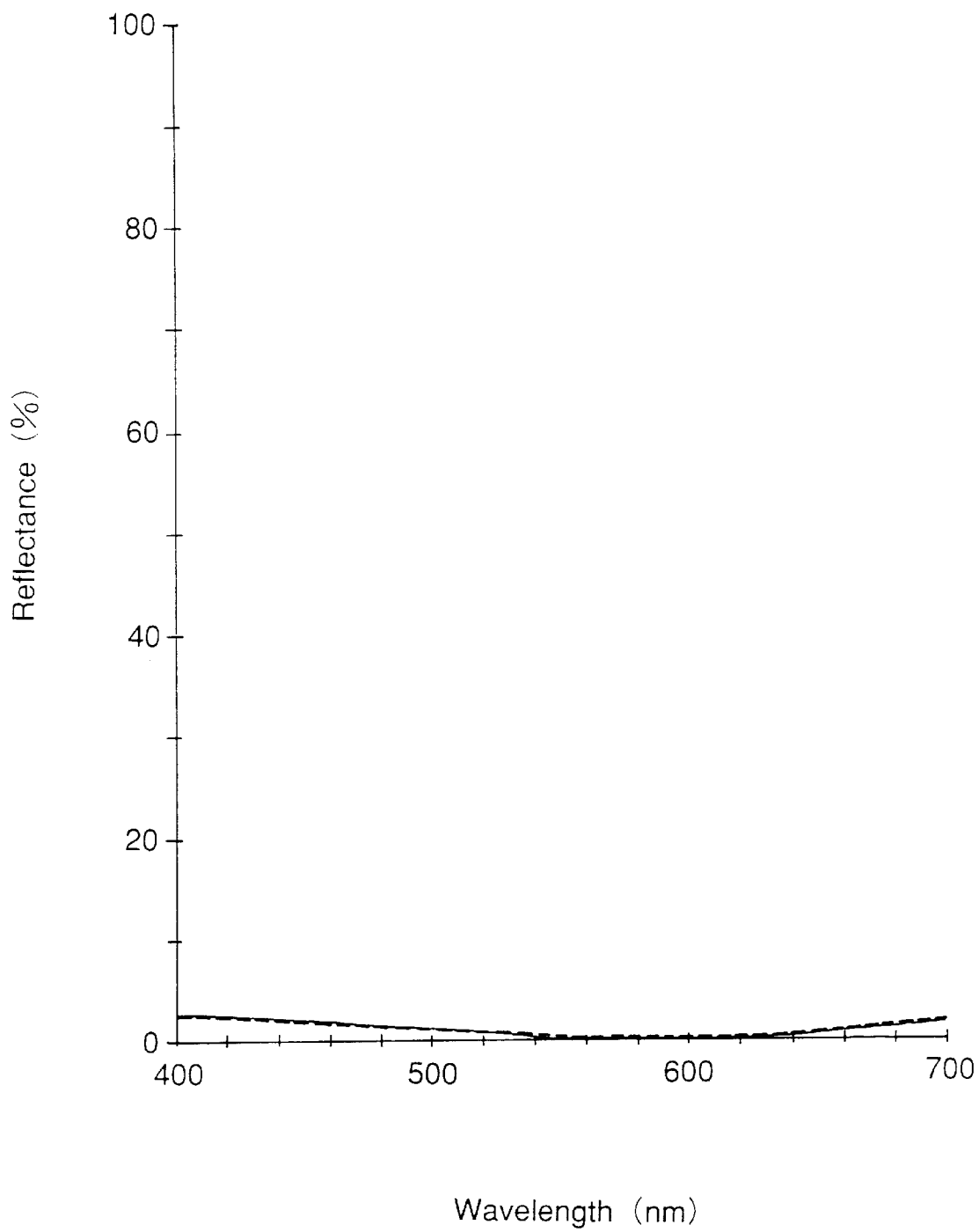
FIG. 5 is a graph illustrating a spectral reflectance of a black matrix made by the method and apparatus in accordance with one embodiment of the present invention.
Figure 6:
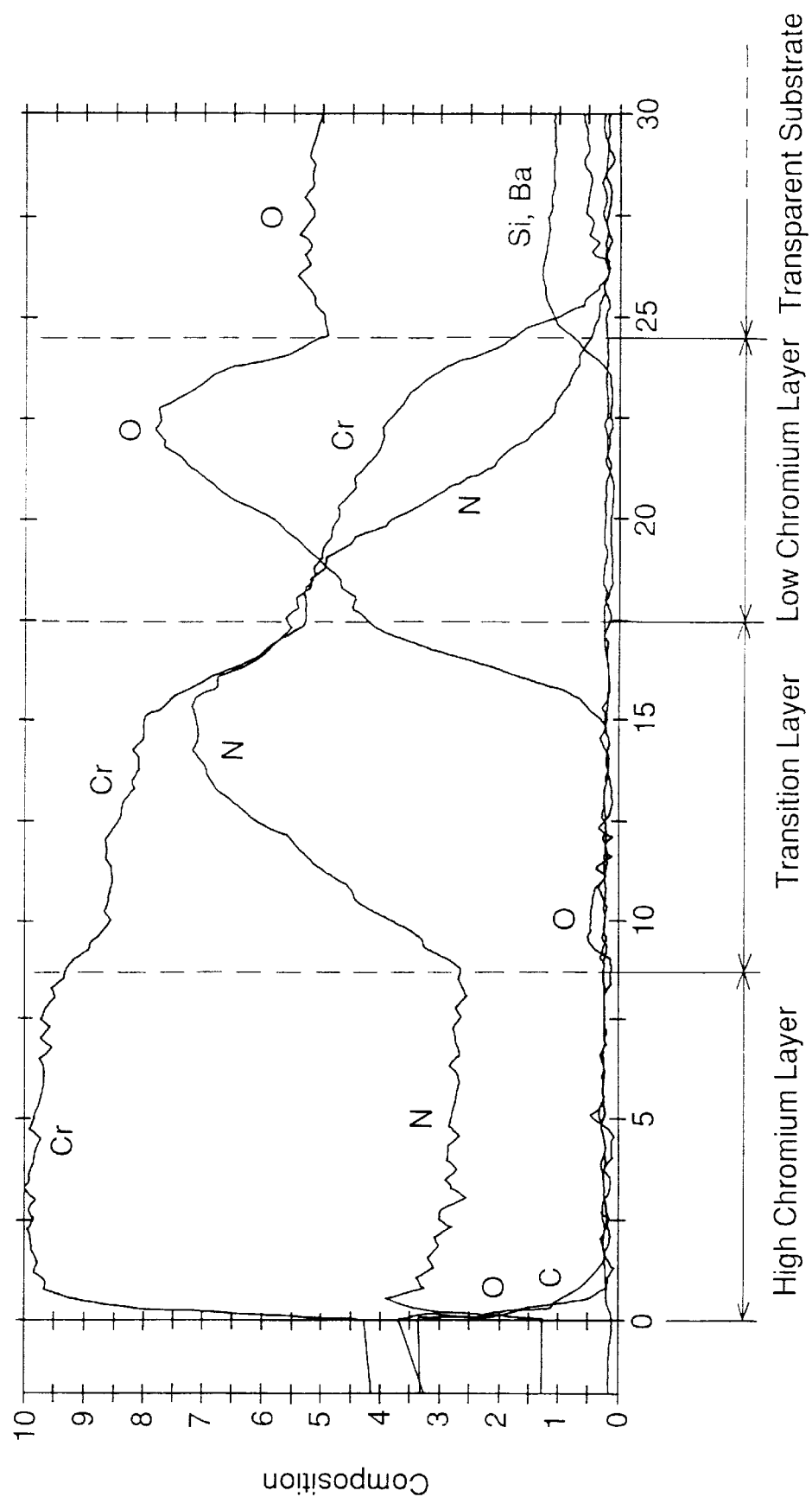
FIG. 6 is a diagram illustrating the elemental chromium distribution in the chromium oxide film of the black matrix shown in FIG. 5.
Figure 7:
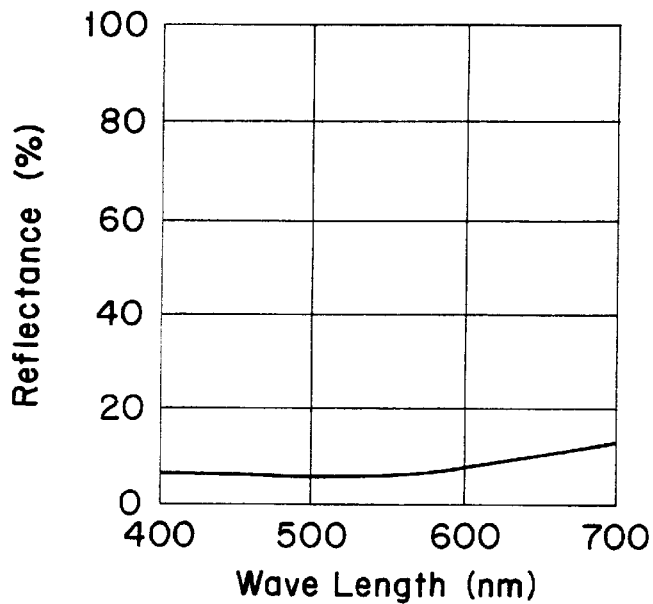
FIG. 7 is a graph illustrating the spectral reflectance of a black matrix without a transition layer and made by a prior art method and apparatus.
Figure 8:
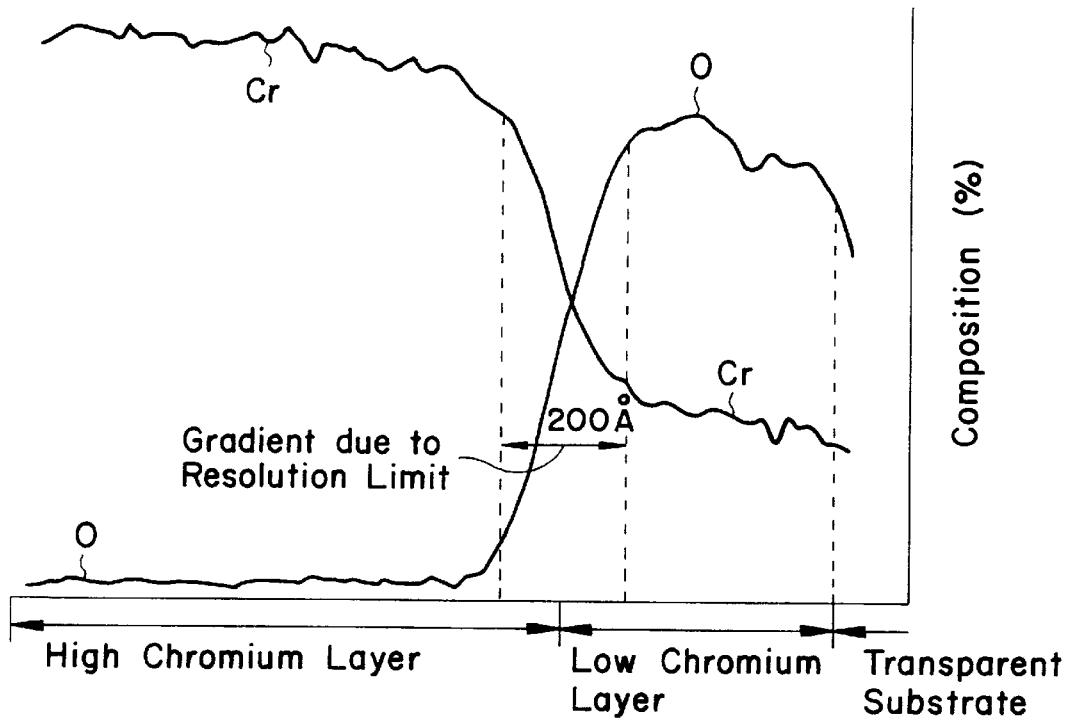
FIG. 8 is a diagram illustrating the elemental chromium distribution in the chromium oxide film of the black matrix shown in FIG. 7.

FIGS. 5 through 8 are experimental results demonstrating the effects of the present invention. FIG. 5 shows a spectral reflectance of a black matrix prepared by the method and apparatus according to the embodiment of the present invention set forth above. FIG. 6 is a graph illustrating the chromium content distribution in the chromium oxide film of the black matrix shown in FIG. 5. FIG. 7 shows a spectral reflectance of a black matrix prepared without a transition layer in accordance with the prior art. FIG. 8 is a graph illustrating the chromium content distribution in the black matrix shown in FIG. 7. In FIGS. 5 and 7, the numbers on the x-axis indicate wave length in nanometers, and the numbers on the y-axis indicate percent reflectance. Further, in FIGS. 6 and 8, each number on the x-axis indicates the position in the film thickness direction in which the external light enters from the right toward the left liquid crystal side, and the numbers on the y-axis indicate oxygen and chromium contents in which the curves Cr and O indicate the results of the chromium and oxygen contents, respectively.

FIG. 5 shows that the bottom reflectance in the present invention is almost zero, and the highest reflectance is at most 5% according to this embodiment of the present invention. FIG. 6 shows that the chromium content in the chromium oxide film is 40% in the low chromium layer and 90% in the high chromium layer. In the transition layer, the chromium content increases by 50% per 300 angstroms, or 17% per 100 angstroms. In FIG. 6, although the thickness of the gradient layer of the chromium or oxygen content is around 500 angstroms, its actual thickness seems to be around 300 angstroms because the measurement is carried out with an Auger spectrometer having a resolution of 200 angstrom.

In contrast, in the black matrix of the prior art, the bottom reflectance is around 5%, and the highest reflectance is 10% or more. In this case, as shown in FIG. 8 the thickness of the gradient layer of the chromium or oxygen content is only 200 angstroms, which is equivalent to the resolution of the spectrometer. Thus, FIG. 8 demonstrates that a transition layer does not substantially exist in the black matrix of the prior art.

Figure 9:
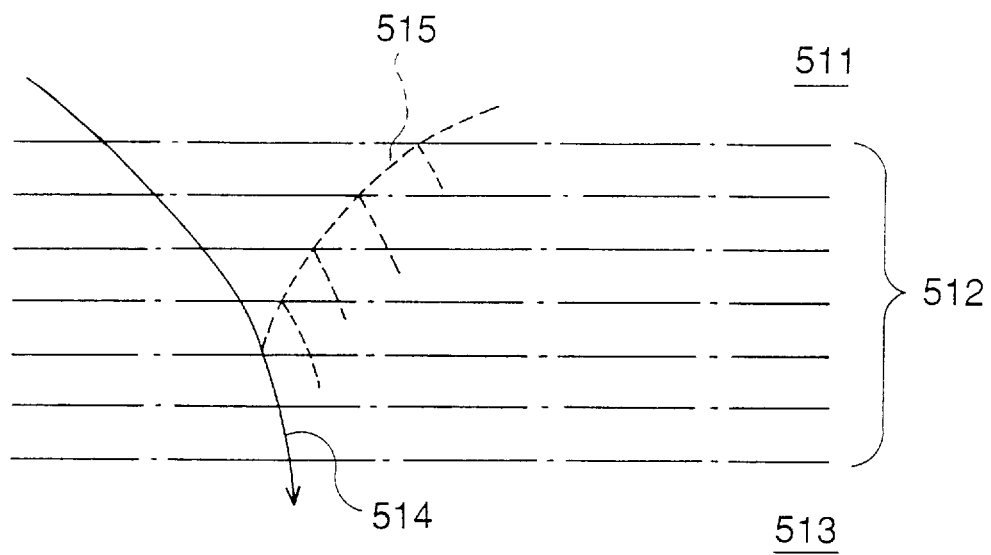
FIG. 9 is a schematic diagram of a cross-section of the transition layer illustrating the decrease in the reflectance.

While not wishing to be bound by any theory, the following is believed to provide an explanation of why the presence of a transition layer reduces reflectance. FIG. 9 is a schematic diagram of the cross-section of the transition layer 512. The gradual increase of the elemental chromium content in the transition layer 512 means the gradual increase of the refractive index in the media. Due to the nature of light which is reflected toward the medium having a higher refractive index, the incident angle of the external light entering the transition layer 512 gradually decreases in the media as shown by arrow 514 in FIG. 9. When the light enters the high chromium layer 513, the incident angle sharply decreases so that the reflectance in the high chromium layer 513 is depressed. Furthermore, even if the light 515 reflected midway in the transition layer 512 proceeds first toward the low chromium layer 511, the light 515 is gradually refracted toward the high chromium layer 513 and approaches the tangent direction of the incident face. This is because the refractive index of the transition layer 512 gradually decreases in the direction of the reflected light. It is considered that the reflected light returning through the transparent substrate 2 decreases by means of such a process.

The chromium content of the low chromium layer 511 is preferably between about 10 and about 40%. The chromium content of the high chromium layer 513 is preferably between about 50% and about 100%, more preferably between about 80% and about 100%, and most preferably about 100%. The difference in the chromium content of the high chromium layer 513 and the chromium content of the low chromium layer 511 is preferably at least about 20%, and the gradient of the chromium content in the transition layer 512 preferably ranges from about 0.5% to about 20% per 100 angstroms.

In order to minimize reflectance, it is desirable for the transition layer 512 to have a gradual gradient of the chromium content. This can be achieved by increasing the thickness of the transition layer 512. However, the maximum thickness of the transition layer 512 is limited by the total thickness of the black matrix.

One example of the thickness and chromium content of the chromium oxide film 51 is explained below. When it is desirable to have the total thickness of the chromium oxide film 51 be approximately 2,000 angstroms, the thickness of the transition layer should be set at about 500 angstroms. The chromium content in the low chromium layer 511 should be about 30%. The chromium content should then increase by about 10% per 100 angstroms in the transition layer 512 until a chromium content of approximately 80% is reached in the high chromium layer 513. The thickness of the high chromium layer 513 is generally from 1,000 to 1,400 angstroms so as to shield completely the light from the back light. However, since the low chromium layer 511 is not required, it can be eliminated, and the transition layer 512 can be formed directly on the surface of the transparent substrate 2.

A feature of the method and apparatus in this embodiment of the present invention is that gaseous oxygen is mixed with gaseous nitrogen to dilute the oxygen to a certain ratio to control the gradient of the elemental metal content in the metal oxide film.

One suitable means for controlling the gradient is to adjust the gaseous oxygen flow by controlling the oxygen flow controller 913. For example, when the distance of the discharge space is constant in the moving direction of the transparent substrate 2, it is desirable to increase both the gaseous oxygen flow and the gaseous argon flow at the same time in order to produce a steep gradient of the oxygen partial pressure. By producing a steep gradient of the oxygen partial pressure, it is possible to obtain a steep gradient of the elemental metal content in the metal oxide layer.

However, it has been confirmed by experiments that when the gradient is adjusted by controlling the gaseous oxygen flow, the rate of change of the gradient of the elemental metal content to the rate of change of the gaseous oxygen flow is excessively high. As a result, precise control of the gradient by this method is extremely difficult. Further, since the sputtering efficiency of the target 8 varies with the change of the gaseous oxygen and argon flows, the deposition rate drastically changes over the entire film thickness.

It is has been discovered that one way to solve the above problem is to control the gradient of the elemental metal content by mixing gaseous oxygen with gaseous nitrogen while adjusting the amount of the gaseous nitrogen to be mixed. That is, the total flow of gaseous oxygen/nitrogen mixture is kept constant while the mixing ratio of oxygen and nitrogen is changed. When the ratio of gaseous oxygen to gaseous nitrogen increases, the gradient of the elemental metal content becomes steep; and when the ratio decreases, the gradient becomes gradual.

Because the sputtering is carried out with gaseous nitrogen, the overall sputtered amount does not drastically change, and the overall deposition rate is held substantially constant. The mixing ratio of gaseous oxygen/gaseous nitrogen is adjusted to, e.g., 1:2 to 1:6. The mixing ratio can be controlled with both the oxygen flow controller 913 and the nitrogen flow controller 915. Therefore, in this embodiment these controllers act as a mixing ratio controlling means.

The gradient of the elemental metal content can also be controlled by adjusting the balance of the evacuation speeds between a plurality of pumping systems. This method can be used in lieu of or in combination with the mixing ratio controlling means described above. The apparatus in accordance with this embodiment has a first pumping system 631 mainly for evacuating the gaseous oxygen/nitrogen mixture injected from the first inlet pipe 911 and a second pumping system 632 mainly for evacuating gaseous argon injected from the second inlet pipe 921. In this embodiment, the gradient of the oxygen partial pressure can be controlled by adjusting the evacuation ratio controllers 633 and 634 in their respective pumping systems 631 and 632. By controlling the gradient of the oxygen partial pressure, an optimum elemental metal content gradient can be achieved.

The gradient of the elemental metal content can further be adjusted by controlling the balance of the input power to a plurality of cathodes 7. That is, the applied voltage to each cathode 7 can be adjusted so that the sputtered amount of each target 8 is changed. For example, when the input power to the cathode 7 near the first inlet pipe 911 is raised compared to that of another cathode, the sputtered amount relatively increases at a position of a higher oxygen partial pressure. Thus, when the substrate 2 passes through such a position, the elemental metal content in the deposited metal oxide film drastically decreases or, in other words, the gradient of the elemental metal content becomes steep.

EXAMPLE

The present invention will be further explained based on the following example. The present invention in this example was carried out at the following conditions:

Gaseous oxygen flow: 50±10 sccm,

Gaseous nitrogen flow: 300±100 sccm,

Gaseous argon flow: 100±20 scam,

Evacuation speed of first pumping system 631: 1,500±500 liters/min.,

Evacuation speed of second pumping system 632: 3,000±1,000 liters/min.,

Total pressure of deposition chamber 63: 0.4±0.2 Pa,

Input power to first cathode 7: 2,000±500 W,

Input power to second cathode 7: 2,500±500 W,

Length of target 8 in moving direction: 150 mm,

Distance between two cathodes 7: 150 mm, and

Moving speed of moving tray 200: 100 mm/min.

A chromium oxide film having a low reflectance as shown in FIGS. 5 and 6 set forth above was deposited by film deposition using two pure chromium targets 8 under the above conditions.

Approximate oxygen partial pressures at various positions were 0.2 Pa near the front end of the upstream cathode 7, and 0.1 Pa near the front end of the downstream cathode 7, respectively. Because the distance between the cathodes was approximately 450 mm, the gradient of the oxygen partial pressure was approximately $0.2 \times 10^{-4}$ Pa/mm.

Figure 11:
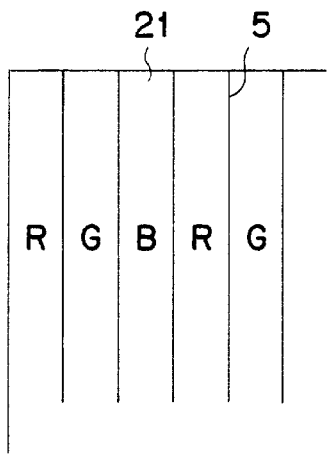
FIG. 11 is a plan view illustrating an arrangement of stripe pixels making up the color filter.

In order to form a black matrix, a thin film is patterned as shown in FIG. 11. A desired pattern is formed through exposure, development, and etching processes after the film deposition process.

A linear gradient of the elemental metal content has been explained in the embodiment in accordance with the present invention set forth above. In addition to being linear, the gradient may be concave, convex, or stepwise. In a stepwise gradient, the increment of each step should be at most about 20% since it is expected that a greater increment offsets the effect of the decreased reflectance.

Gradual and stepwise gradients are equivalent to each other from a technical standpoint as explained in the above embodiment.

Additives may be included in the chromium oxide film described above. In particular, a specified material may often be added for improving the adhesiveness of the film.

The present invention is also applicable to metal oxide films other than chromium oxide films. Other suitable metal oxide films include a silicon oxide film in which the silicon content gradually increases, a tungsten oxide film in which the tungsten content gradually increases, and a tantalum oxide film in which the tantalum content gradually increases.

A black matrix has been explained as a thin film for a liquid crystal display in the present invention. However, the method and the apparatus in accordance with the present invention are applicable to an ITO (Indium Tin Oxide) film to form a drive electrode, a $SiO_2$ film to form an insulating layer between drive electrodes, and a $Ta_2O_5$ film as an insulating layer of Ta used for a drive electrode in an MIM (Metal Insulator Metal) method.

In the example set forth above, the thin film is deposited on the surface of the transparent substrate 2 of the liquid crystal display which external light enters. Thus, the gaseous oxygen partial pressure decreases in the moving direction of the transparent substrate 2. When the thin film is deposited on the back-light side of the transparent substrate 2, the gaseous oxygen partial pressure is controlled so as to obtain an increase in the moving direction. For example, this can be accomplished by injecting gaseous argon from the first inlet pipe 911 and gaseous oxygen/nitrogen mixture from the second inlet pipe 921.

In the embodiment of the present invention described above, two cathodes were employed. However, one cathode, or three or more cathodes may be used. In particular, when a thick low and/or high chromium layer is deposited, another cathode 7 can be provided at a position in which the gaseous oxygen partial pressure does not significantly change.

Additionally, in the embodiment set forth above, the film was deposited while the transparent substrate 2 was moving. However, the film can be deposited while the transparent substrate 2 moves only intermittently. Further, a moving tray 200 that can hold and move two or more substrates 2 at one time can also be used.

What is claimed is:

1. A method for forming a thin film comprising a metal oxide on a substrate by reactive sputtering, said method comprising the steps of:

(a) introducing gaseous argon and gaseous oxygen to a space in front of a cathode, said cathode comprising a target which comprises an elemental metal to be deposited; and (b) depositing a thin film comprising a metal oxide of said metal on said substrate while moving said substrate parallel to the front of said target, said thin film having a concentration gradient of said elemental metal across its thickness, wherein (i) said gaseous argon and said gaseous oxygen are introduced in a manner such that the partial pressure of said gaseous oxygen is lower at the upstream or the downstream side of the moving direction of said substrate, (ii) said gaseous oxygen is diluted with gaseous nitrogen at a predetermined ratio, and (iii) said thin film is deposited while adjusting said concentration gradient.

2. The method according to claim 1, wherein said thin film comprising said metal oxide forms a black matrix in a liquid crystal color display.

3. The method according to claim 1, wherein said metal is silicon, chromium, tungsten, tantalum, indium, tin, or combinations thereof.

4. The method according to claim 3, wherein said metal is chromium.

5. The method according to claim 1, wherein said gaseous oxygen is introduced to flow in the moving direction of the substrate.

6. The method according to claim 1, wherein said gaseous oxygen is introduced directly into a deposition chamber which includes therein said cathode.

7. An apparatus for forming a thin film comprising a metal oxide on a substrate by reactive sputtering, said apparatus comprising:

a cathode comprising a target which comprises an elemental metal to be deposited, said cathode being disposed in a vacuum chamber having a pumping system;

an oxygen gas inlet for introducing gaseous oxygen to a space in front of said cathode in said vacuum chamber;

an argon gas inlet for introducing gaseous argon to said space in front of said cathode in said vacuum chamber; and a moving system for moving said substrate parallel to the front of said target in said space in front of said cathode, wherein said oxygen gas inlet introduces said gaseous oxygen in a manner such that the partial pressure thereof is lower at the upstream or the downstream side of the moving direction of said substrate, and said oxygen gas inlet comprises a mixer for mixing gaseous nitrogen with said gaseous oxygen to dilute said gaseous oxygen to a predetermined ratio so as to adjust the concentration gradient of said elemental metal across the thickness of said thin film.

8. The apparatus according to claim 7, comprising a plurality of said cathodes, wherein each of said cathodes is disposed in the moving direction of said substrate and comprises an independently controlled electrical power supply.

9. The apparatus according to claim 7, wherein said oxygen gas inlet comprises a gaseous oxygen inlet system for introducing said gaseous oxygen and said argon gas inlet comprises a gaseous argon inlet system for introducing said gaseous argon, said gaseous oxygen inlet system comprising a flow control device for controlling the flow of said gaseous oxygen and said gaseous argon inlet system comprising a flow control device for controlling the flow of said gaseous argon.

10. The apparatus according to claim 9, wherein said gaseous oxygen inlet system further comprises an adjuster for adjusting the mixing ratio of said gaseous nitrogen and said gaseous oxygen.

11. The apparatus according to claim 10, further comprising a gaseous oxygen pumping system for evacuating said vacuum chamber disposed in proximity to said gaseous oxygen inlet system, a gaseous argon pumping system for evacuating said vacuum chamber disposed in proximity to said gaseous argon inlet system, wherein said gaseous oxygen pumping system and said gaseous argon pumping system comprise an evacuation rate controller for controlling the evacuation rate thereof.

12. The apparatus according to claim 7, wherein said oxygen gas inlet is disposed inside said vacuum chamber.

13. The apparatus according to claim 7, wherein said oxygen gas inlet comprises at least one inlet nozzle directed downstream of the moving direction of the substrate.

* * * * *